(12) United States Patent
Hizume et al.

(10) Patent No.: US 8,153,479 B2
(45) Date of Patent: Apr. 10, 2012

(54) METHOD OF MANUFACTURING SEMICONDUCTOR PACKAGE

(75) Inventors: Tohru Hizume, Nagano (JP); Akihiko Tateiwa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 57 days.

(21) Appl. No.: 12/858,921

(22) Filed: Aug. 18, 2010

(65) Prior Publication Data

US 2011/0045642 A1 Feb. 24, 2011

(30) Foreign Application Priority Data

Aug. 21, 2009 (JP) ................................. 2009-191844

(51) Int. Cl.
*H01L 21/00* (2006.01)
(52) U.S. Cl. . 438/126; 438/106; 438/118; 257/E21.001; 257/E21.502
(58) Field of Classification Search .................. 438/126; 257/E21.502
See application file for complete search history.

(56) References Cited

U.S. PATENT DOCUMENTS

| | | | | |
|---|---|---|---|---|
| 5,353,195 | A * | 10/1994 | Fillion et al. | 361/760 |
| 5,866,952 | A * | 2/1999 | Wojnarowski et al. | 257/788 |
| 6,154,366 | A * | 11/2000 | Ma et al. | 361/704 |
| 6,838,776 | B2 * | 1/2005 | Leal et al. | 257/783 |
| 7,202,107 | B2 | 4/2007 | Fuergut et al. | |
| 7,294,529 | B2 * | 11/2007 | Tuominen | 438/107 |
| 7,485,562 | B2 * | 2/2009 | Chua et al. | 438/613 |
| 2009/0152715 | A1 * | 6/2009 | Shim et al. | 257/737 |
| 2011/0001245 | A1 * | 1/2011 | Jobetto | 257/773 |

FOREIGN PATENT DOCUMENTS

| | | |
|---|---|---|
| JP | 2004-47543 | 2/2004 |
| JP | 2004-103665 | 4/2004 |
| WO | 02/15266 | 2/2002 |
| WO | 02/33751 | 4/2002 |

* cited by examiner

*Primary Examiner* — Angel Roman
(74) *Attorney, Agent, or Firm* — Drinker Biddle & Reath LLP (57) ABSTRACT

A method of manufacturing a semiconductor package comprises: preparing a photosensitive insulating material having a first surface and a second surface opposite to the first surface; bonding a semiconductor chip to the first surface of the photosensitive insulating material with a connecting terminal of the semiconductor chip facing the first surface of the photosensitive insulating material; exposing the second surface of the photosensitive insulating material after the bonding the semi-conductor to the first surface of the photosensitive material; encapsulating the first surface of the photosensitive insulating material, and the semiconductor chip bonded to the first surface, with a resin to form a resin encapsulated portion after exposing the second surface of the photosensitive insulating material; and developing the photosensitive insulating material, thereby forming a through-hole communicating with the connecting terminal of the semiconductor chip in the photosensitive insulating material after the exposing the second surface of the photosensitive insulating material.

11 Claims, 6 Drawing Sheets

METHOD OF MANUFACTURING SEMICONDUCTOR PACKAGE

This application claims priority to Japanese Patent Application No. 2009-191844, filed Aug. 21, 2009, in the Japanese Patent Office. The Japanese Patent Application No. 2009-191844 is incorporated by reference in its entirety.

TECHNICAL FIELD

The present disclosure relates to a method of manufacturing a semiconductor package.

RELATED ART

JP-A-2004-103665 Publication (Patent Document 1) discloses a technique for providing an insulating substrate on a chip in a state that the insulating substrate faces an electrode of the chip, generating an ion exchanging group in the insulating substrate by exposure and forming a through-conductor connected to the electrode of the chip by nonelectrolytic plating.

Moreover, JP-A-2004-47543 Publication (Patent Document 2) discloses a technique for forming a buildup of multilayer wirings on a chip by using a photosensitive resin film for a first layer seen from the chip and using a non-photosensitive resin film for the other layers. A via hole corresponding to an electrode of the chip is formed by exposure and development of the photosensitive resin film.

Furthermore, WO 02/15266 (Patent Document 3), WO 02/33751 (Patent Document 4) and U.S. Pat. No. 7,202,107 (Patent Document 5) disclose a technique for stacking a wiring layer and an insulating layer on an active surface of a chip and a sealing resin surrounding the chip, thereby forming a package substrate.

[Patent Document 1] JP-A-2004-103665 Publication
[Patent Document 2] JP-A-2004-47543 Publication
[Patent Document 3] WO 02/15266
[Patent Document 4] WO 02/33751
[Patent Document 5] U.S. Pat. No. 7,202,107

In order to manufacture a semiconductor package (a semiconductor device) in which a semiconductor chip is formed into a package, flip chip mounting using a solder may be utilized, for example. A connecting terminal of the semiconductor chip has been enhanced in a fineness of pitch with an increase in integration and density of a semiconductor element. For this reason, processing corresponding to the enhancement in fineness and the density is also carried out over a substrate side on which the semiconductor chip is to be mounted.

Building up a wiring layer by a semi-additive process or a subtractive process is a main method of b of a manufacture of a package substrate. However, it is believed that a limit in the enhancement in the wire fineness will soon be reached. As means for solving the problem, various approaches have been made to enhance the fine pitch of the wiring layer using chip mounting. For instance, fine wiring has been tried to be variously formed in the manufacture of the package substrate (for example, Patent Documents 3 to 5).

With increasing density of semiconductor element, a semiconductor package which copes with the enhancement of pitch fineness has been greatly demanded. However, when flip chip mounting using solder is utilized for mounting the semiconductor chip on the semiconductor package, connecting reliability deteriorates due to migration of the solder with the enhancement in the fine pitch. Consequently, a manufacturing yield is reduced.

Moreover, manufacture of a package substrate using the related-art manufacturing process techniques described in Patent Documents 3 to 5 is effective for forming a fine wiring, for example. However the techniques according to the related art have a greatly increased cost. Furthermore, the techniques for forming fine wiring can only be applied to very smooth surfaces. Thus, if these techniques are used, it can be difficult to formed fine wiring on a substrate having a warping or a waviness (such as an organic substrate), which results in a reduction in manufacturing yield.

Moreover, using a technique for forming a wiring on a sealing resin again, it can be difficult to form a fine wiring due to steps or warping of an upper surface of the sealing resin and an active surface of a chip. Thus, thermal expansion caused by heat treatment of the sealing resin or a chip misalignment caused by a contraction of a resin can result in a reduction in manufacturing yield.

SUMMARY

Exemplary embodiments of the present invention provide a method of manufacturing a semiconductor package which can improve manufacturing yield.

A method of manufacturing a semiconductor package according to an exemplary embodiment comprises: preparing a photosensitive insulating material having a first surface and a second surface opposite to the first surface; bonding a semiconductor chip to the first surface of the photosensitive insulating material with a connecting terminal of the semiconductor chip facing the first surface of the photosensitive insulating material; exposing the second surface of the photosensitive insulating material after the bonding the semiconductor to the first surface of the photosensitive material; encapsulating the first surface of the photosensitive insulating material, and the semiconductor chip bonded to the first surface, with a resin to form a resin encapsulated portion after exposing the second surface of the photosensitive insulating material; and developing the photosensitive insulating material, thereby forming a through-hole communicating with the connecting terminal of the semiconductor chip in the photosensitive insulating material after the exposing the second surface of the photosensitive insulating material.

According to exemplary embodiments of the present invention, a manufacturing yield of the semiconductor package may be improved.

DETAILED DESCRIPTION

An exemplary embodiment according to the invention will be described below in detail with reference to the drawings. In all of the drawings for explaining the embodiment, members having the same function have been given the same reference numerals and repetitive description thereof will be omitted in some cases.

Figure 1:
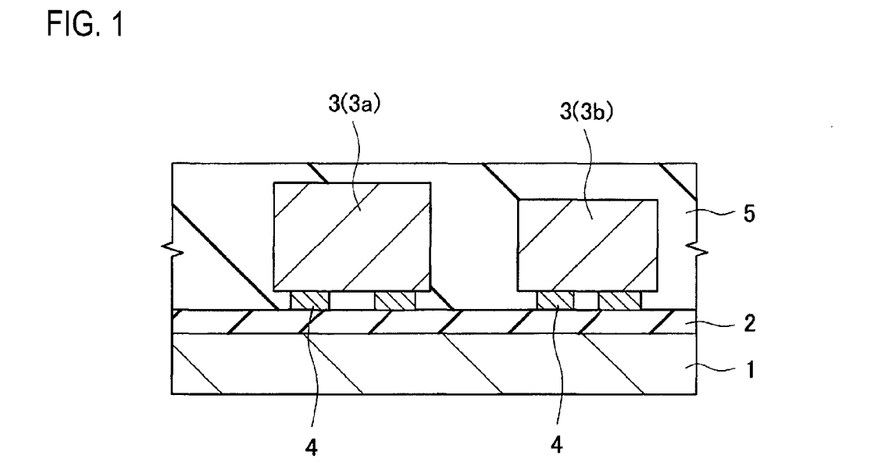
FIGS. 1 to 3 are exemplary sectional views showing manufacturing processes of a semiconductor package investigated by the inventors.

First, a technique for manufacturing a semiconductor package (a semiconductor device) investigated by the inventors will be described with reference to FIGS. 1 to 4. As shown in FIG. 1, a metal plate 1 having an adhesive material 2 stuck thereto was prepared. The metal plate 1 is a wafer-shaped base material used in the manufacture of a semiconductor package, and the adhesive material 2 serves to temporarily fix a semiconductor chip (hereinafter referred to as a chip) 3 to the metal plate 1.

After the metal plate 1 having the adhesive material 2 is prepared, the chip 3 (for example, two chips) having a connecting terminal 4 on a surface is bonded and mounted onto the adhesive material 2 in a state that the connecting terminal 4 faces the adhesive material 2 and the chip 3 is encapsulated by a mold resin 5. The connecting terminal 4 protrudes from the surface of the chip 3. Therefore, the connecting terminal 4 is sunk into the adhesive material 2 during the mounting. As shown in FIG. 1, if there is a good adhesive force between the adhesive material 2 and the chip 3, the connecting terminal 4 and the mold resin 5 form a flat surface after resin encapsulation. Moreover, the chip 3 is formed with an enhanced in fineness and density.

Figure 2:
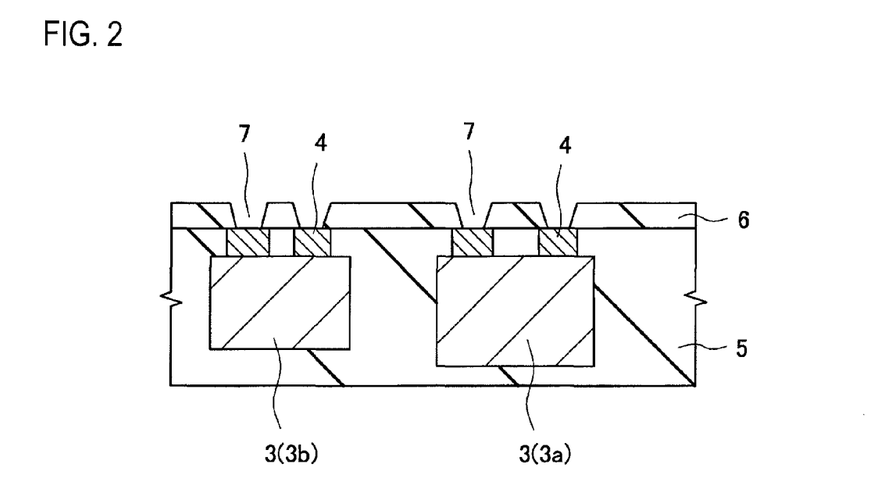

Subsequently, the metal plate 1 including the adhesive material 2 is separated (peeled) from the chip 3 encapsulated by the resin, and a photosensitive insulating film 6 is then formed on a surface of the mold resin 5 by spin coating, for example. Further, a via hole 7 communicating with the connecting terminal 4 is thereafter formed on the insulating film 6 using a photolithographic technique as shown in FIG. 2. The formation of the via hole using the photolithographic techniques can be carried out in a smaller diameter than formation of a via hole using a laser via technique, for example. Therefore, it is possible to cope with a connection to the chip 3, which is enhanced in fineness and density.

Figure 3:
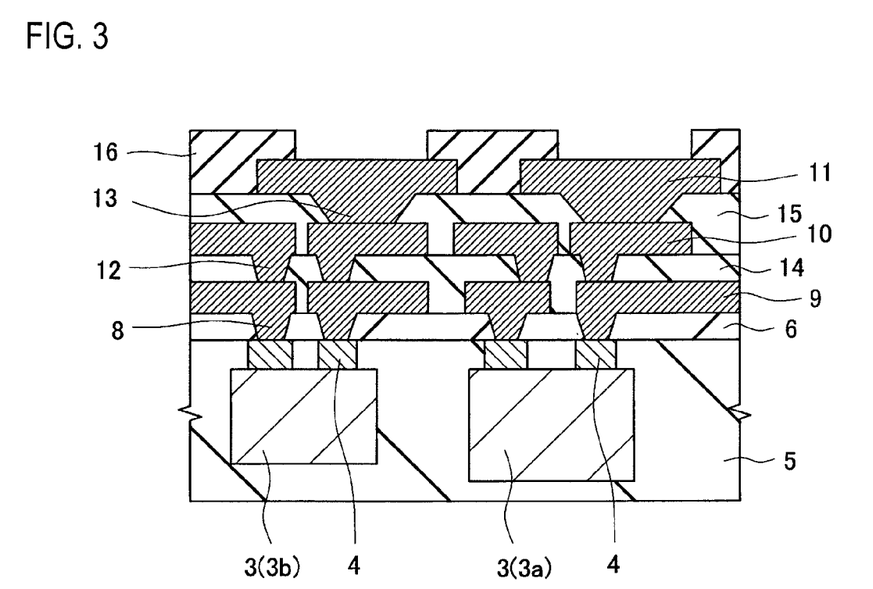

As shown in FIG. 3, a conductive material (for example, a copper plated film) to be electrically connected to the connecting terminal 4 is then formed in the via hole 7 so that a via 8 is formed, and a wiring layer 9 electrically connected to the via 8 is formed on the insulating film 6. Subsequently, wiring layers 10 and 11, vias 12 and 13, insulating films 14 and 15, and a solder resist layer 16 are formed by a buildup process so that the semiconductor package is almost finished.

Figure 4:
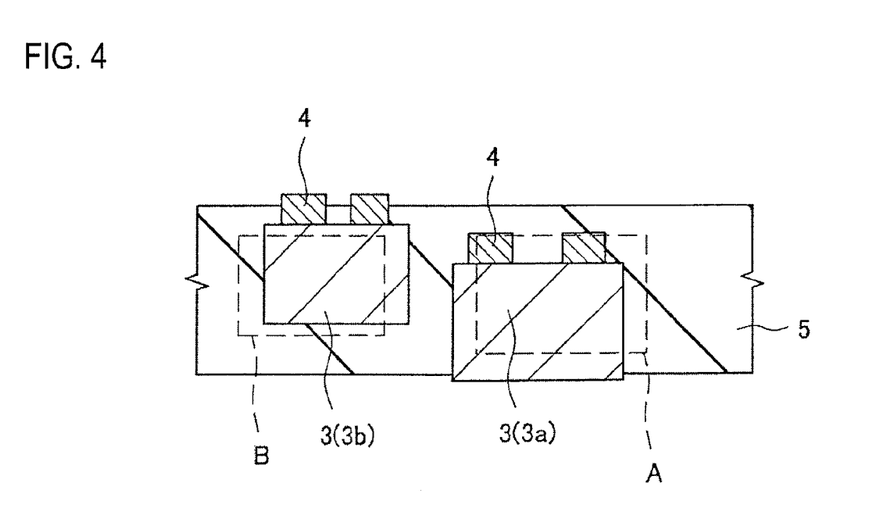
FIG. 4 is an exemplary sectional view showing a drawback of the semiconductor package investigated by the inventors.

However, the inventors found that the step of carrying out the resin encapsulation with the mold resin 5 has the following drawbacks. First of all, expansion of the metal plate 1 or a contraction of the mold resin 5 occurs due to an influence of heat (for example, approximately 150° C. to 170° C.) at the resin encapsulation step causing a position of the chip 3 to be shifted considerably from a design reference value in some cases. FIG. 4 shows positions based on the design reference value of chips 3a and 3b to encapsulated with the mold resin 5 in broken lines A and B respectively, and illustrates a state in which the positions of the chips 3a and 3b are shifted from the design reference value.

Moreover, as shown by chip 3a shown in FIG. 4, the mold resin 5 spreads over tip end portions of the connecting terminal 4 at the resin encapsulation step in some cases, so that an electrical connection cannot be ensured. After the resin encapsulation step, the metal plate 1 is separated (peeled) from the chip 3 and the mold resin 5. Therefore, an adhesive force of the adhesive material 2 and the chip 3 is not increased for purpose of the separation. For this reason, in some cases when the adhesive force of the adhesive material 2 is excessively small, the mold resin 5 spreads over the tip end portion of the connecting terminal 4 due to a pressure during the resin encapsulation step.

On the other hand, it is supposed that the connecting terminal 4 protrudes from the surface of the mold resin 5 corresponding to a height of the connecting terminal 4 sunk into the adhesive material 2 as in the chip 3b shown in FIG. 4 when the adhesive force of the chip 3 and the adhesive material 2 is excessively great.

For this reason, in the semiconductor package formed by the steps described above, drawbacks can occur such as when a flat insulating film cannot be formed during the formation of the insulating film 6, the insulating films 14 and 15, and the solder resist layer 16, or a connecting failure occurs due to mask misalignment in the formation of the via hole 7, or a defective conduction of the via 8 itself occurs, for example.

Although the formation of the via hole 7 using the photolithographic technique is effective for the connecting terminal 4 of the chip 3, which is enhances the fineness and the density, these drawbacks are caused.

Next, a technique for manufacturing a semiconductor package (a semiconductor device) based on the investigations by the applicants will be described with reference to FIGS. 5 to 12.

Figure 5:
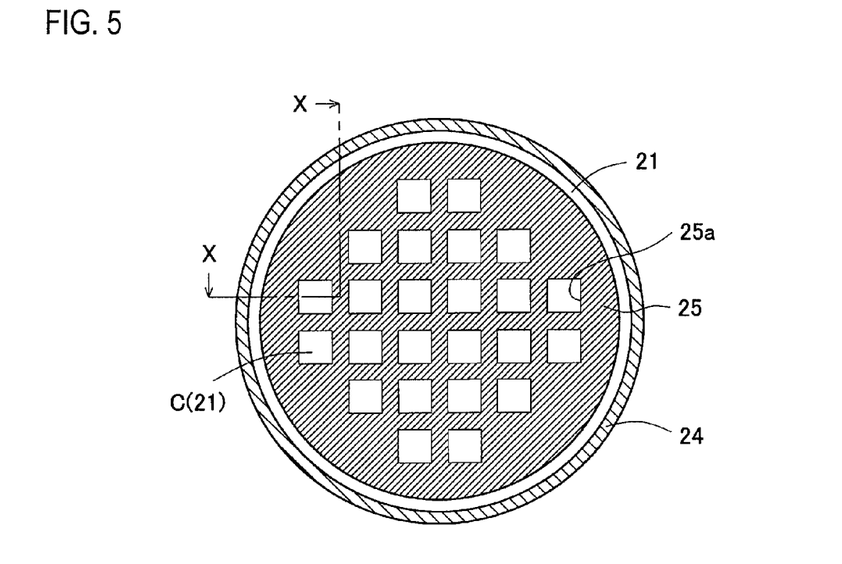
FIG. 5 is an exemplary plane view showing a photosensitive insulating material according to an embodiment of the present invention.
Figure 6:
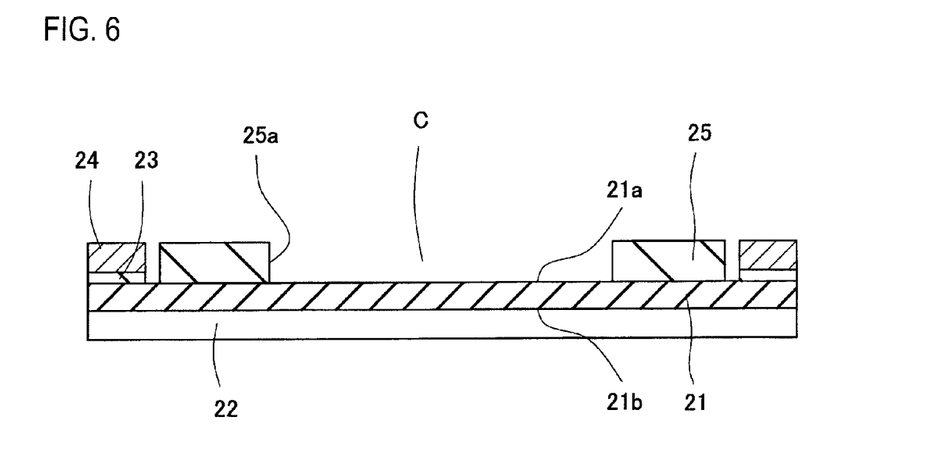
FIG. 6 is an exemplary sectional view taken along line X-X of FIG. 5 according to the embodiment of the present invention.

First of all, as shown in FIGS. 5 and 6, a photosensitive insulating material 21 having a front face 21a (a first surface) on a front side thereof and a back face 21b (a second surface) on a back side thereof is prepared. The photosensitive insulating material 21 has an adhesive property in a non-curing state. For example, the photosensitive insulating material 21 is formed by a photosensitive resin having a curing temperature of approximately 200° C. and having a thickness of approximately 6 μm to 10 μm. For the photosensitive insulating material 21, it is possible to use a photosensitive resin such as an epoxy based resin, a polyimide based resin or a phenol based resin. In the embodiment, a semiconductor chip is bonded to (mounted on) the photosensitive insulating material 21 at the front face 21a side.

A tape 22 for transmitting an exposing light (for example, an ultraviolet light) to be used at an exposing step for the photosensitive insulating material 21 is bonded (stuck) to the back face 21b of the photosensitive insulating material 21. The tape 22 is a base material for the photosensitive insulating material 21 and is constituted by PET (polyethylene terephthalate) and a silicone based adhesive material applied thereto, for example, and has an entire thickness of approximately 25 μm to 30 μm. In other words, there is prepared the photosensitive insulating material 21 in which the tape 22 is bonded to the back face 21b through the silicone based adhesive material. It is preferable that the tape 22 for transmitting the exposing light should have a small coefficient of thermal expansion. The reason for this is that the misalignment of the semiconductor chip to be mounted on the photosensitive insulating material 21 should be prevented from being caused by a thermal expansion. The photosensitive insulating material 21 thus prepared can be used in the form of a film in which the back face 21b is bonded to the tape 22, for example. Alternatively, it is possible to carry out the use in a configuration in which a photosensitive resin film is applied to a surface of the tape 22 provided with a mold releasing agent (a fluorine based mold releasing agent or a silicone based mold releasing agent) and the photosensitive insulating material 21 is formed like a layer on the surface of the tape 22.

The tape 22 serves to reinforce the photosensitive insulating material 21 which is thinner than the chip and the like, and also serves to support the photosensitive insulating material 21.

Subsequently, an annular jig 24 (a frame member) having an adhesive material 23 and a reinforcing material 25 disposed on an inside of the jig 24 and having a plurality of opening portions 25a are bonded to the front face 21a of the photosensitive insulating material 21. The jig 24 is formed of a metal such as stainless steel, and has a thickness of approximately 1 mm and a diameter of approximately 8 inches. Moreover, the reinforcing material 25 is formed by a plate or a film having rigidity, for example, a metal (such as copper, stainless steel or aluminum), a resin or glass epoxy, and has a thickness of approximately 100 μm, for example.

By bonding the annular jig 24 to the photosensitive insulating material 21 through the adhesive material 23 (a thickness of approximately several μm, for example), it is possible to bring a state in which the photosensitive insulating material 21 is strained. Thus, the front face 21a and the back face 21b in the photosensitive insulating material 21 can be fixed flatly. Moreover, by using the annular jig 24 it is possible to cause the photosensitive insulating material 21 and the jig 24 to take the same shape as an almost circular semiconductor wafer to be used in a semiconductor process and to treat them in the same manner as the semiconductor wafer in handling.

Furthermore, at a subsequent step a mold resin is formed on the front face 21a of the photosensitive insulating material 21 at the inside of the annular jig 24. In that case, a contraction of the mold resin occurs. In particular, the contraction occurs on an outside of a central side of the front face 21a. Therefore, by disposing the annular jig 24 on the outside of the central side of the photosensitive insulating material 21, it is possible to suppress a contraction of the film-shaped photosensitive insulating material 21 with the contraction of the mold resin.

Moreover, although the photosensitive insulating material 21 has a rigidity ensured by the tape 22 bonded to the back face 21b side, it is possible to enhance the rigidity more greatly by further bonding the reinforcing material 25 to the front face 21a side in the embodiment. On the other hand, in the case in which rigidity strength) of a package can be maintained, the reinforcing material 25 is unnecessary. In addition, the reinforcing material 25 has a plurality of opening portions 25a, and the front face 21a of the photosensitive insulating material 21 is exposed from the opening portions 25a. In the embodiment, the chip is disposed in a chip mounting region C of the front face 21a exposed from the opening portion 25a. The number of chips to be mounted on the single opening portion 25a is optional and one chip or more may be mounted.

Figure 7:
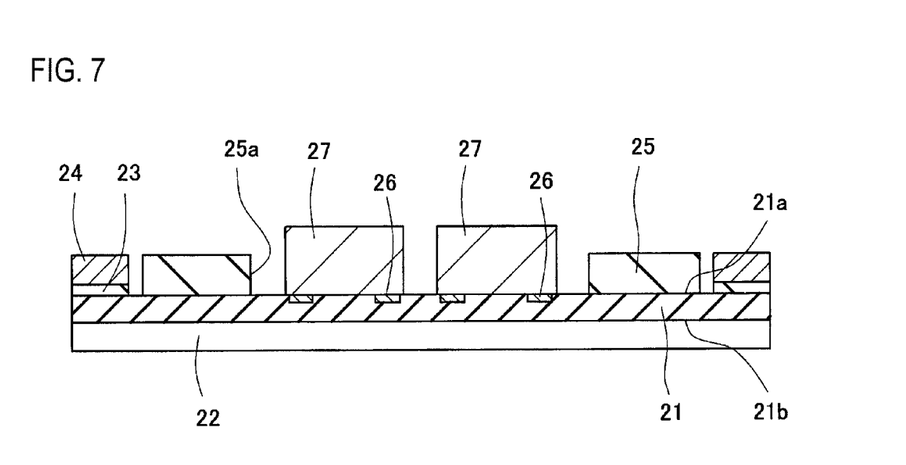
FIGS. 7 to 12 are exemplary sectional views showing manufacturing processes of the semiconductor package according to the embodiment of the present invention.

Then, as shown in FIG. 7 a chip 27 having a connecting terminal 26 on a surface is bonded to and mounted on the front face 21a of the photosensitive insulating material 21 in a state that the connecting terminal 26 faces the front face 21a. For example, a semiconductor element, a wiring layer and a surface protecting film (not shown) for protecting them are formed on the surface side of the chip 27 using a semiconductor manufacturing process. The chip 27 has a thickness of approximately 125 μm to 700 μm, for example. The connecting terminal 26 exposed from the surface protecting film is electrically connected to the semiconductor element. In this embodiment, the connecting terminal 26 protrudes from the surface of the chip 27, and has a height of approximately 1 μm to 5 μm, for example. Alternatively, the connecting terminal 26 may have a height on the level with the surface of the chip 27, and furthermore, may be brought into a burying state in the surface, if an area which can be connected to a via at a subsequent step is ensured.

When the chip 27 is to be mounted on the photosensitive insulating material 21, only the chip 27 is heated by a flip chip bonder while the photosensitive insulating material 21 is not heated. More specifically, the chip 27 is heated at a temperature lower than the curing temperature of the photosensitive insulating material 21, and at the same time, is bonded to the front face 21a of the photosensitive insulating material 21. In the embodiment, a curing temperature of a resin to be used for the photosensitive insulating material 21 is approximately 200° C., for example. Therefore, the chip 27 is heated at approximately 100° C., for example.

Thus, by mounting the chip 27 on the photosensitive insulating material 21 through the heating, it is possible to enhance an adhesive property of the photosensitive insulating material 21 and the surface protecting film (for example, an organic type resin) of the chip 27. Consequently, it is possible to fix the chip 27 to the photosensitive insulating material 21. The photosensitive insulating material 21 is left in a bonding state to the chip 27 in a final semiconductor package. For this reason, the photosensitive insulating material 21 may be strongly fixed to the chip 27.

Therefore, as described with reference to FIG. 4, it is possible to prevent the resin from spreading out during the resin encapsulation. Thus, it is possible to reduce a connecting failure. Accordingly, it is possible to suppress a reduction in a manufacturing yield of the semiconductor package.

Moreover, in the embodiment, a heat treatment is not carried out over the photosensitive insulating material 21 when the chip 27 is to be mounted on the photosensitive insulating material 21. The reason is as follows. When the whole photosensitive insulating material 21 having a size shown in FIG. 5 (for example, approximately 8 inches) is heated and the chip 27 is mounted on each of the chip mounting regions C, a time required for heating the photosensitive insulating material 21 is prolonged so that the photosensitive insulating material 21 is brought into a curing state.

It is supposed that the via hole cannot be formed as previously designed and a connecting failure is thus caused during the exposing and developing steps using the photolithographic technique when the photosensitive insulating material 21 is cured. More specifically, if the photosensitive insulating material 21 is cured, the photosensitivity of the material 21 is reduced and thus, the via hole is difficult to be formed. In the embodiment, therefore, only the chip 27 is heated, and at the same time, is bonded to the photosensitive insulating material 21. Accordingly, it is possible to reduce the connecting failure, thereby suppressing the reduction in the manufacturing yield of the semiconductor package.

Moreover, in the case in which the connecting terminal 26 protrudes from the surface of the chip 27, the chip 27 is mounted on the photosensitive insulating material 21 through the heating so that the connecting terminal 26 is sunk into the photosensitive insulating material 21. The connecting terminal 26 of the chip 27 is also heated. Therefore, the connecting terminal 26 can easily be sunk into the photosensitive insulating material 21, and furthermore, the adhesive property of the chip 27 to the photosensitive insulating material 21 can be enhanced more greatly.

Therefore, as described with reference to FIG. 4, it is possible to prevent the resin from spreading over the connecting terminal of the chip during the resin encapsulation. Thus, it is possible to reduce the connecting failure. Accordingly, it is possible to suppress the reduction in the manufacturing yield of the semiconductor package.

Figure 8:
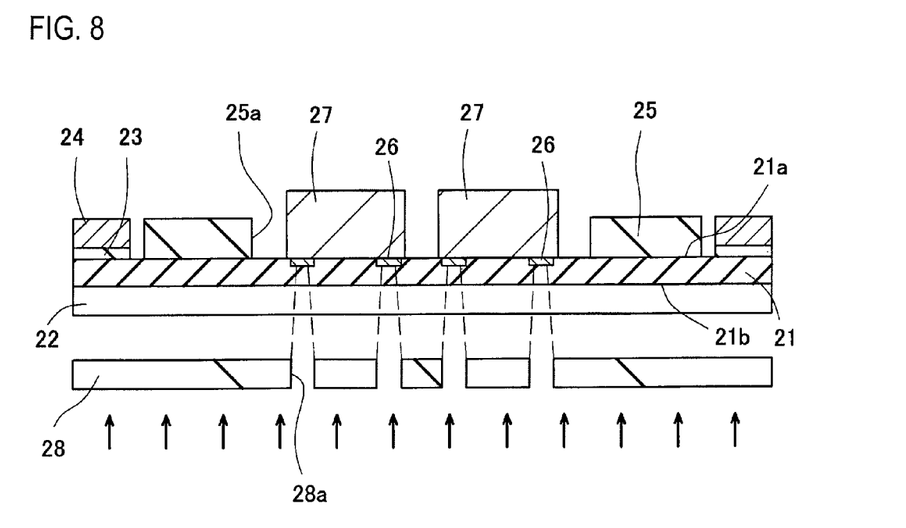

Subsequently, as shown in FIG. 8, the photosensitive insulating material 21 is exposed from the back face 21b side through the transparent tape 22 by using a photomask 28 having an opening portion 28a. In the embodiment, an exposing light (shown in an arrow and a broken line in FIG. 8) passes through the opening portion 28a formed on the photomask 28 to sensitize the photosensitive insulating material 21 in a portion to be a via hole of the chip 21 which reaches the connecting terminal 26.

During the exposing step, it is important to align the opening portion 28a with the connecting terminal 26 in order to form the via hole reaching the connecting terminal 26. In the embodiment, the resin encapsulation step in which the misalignment of the chip described with reference to FIG. 4 occurs is not carried out till the exposing step for forming the via hole. Therefore, it is possible to expose the light to a desirable position with high precision. Consequently, it is possible to reduce a connecting failure of the connecting terminal 26 and the via. Accordingly, it is possible to suppress the reduction in the manufacturing yield of the semiconductor package. In the embodiment, the connecting terminal 26 has a diameter of approximately 30 μm, while a minimum diameter of the via hole can be set to be approximately 10 μm, for example.

Figure 9:
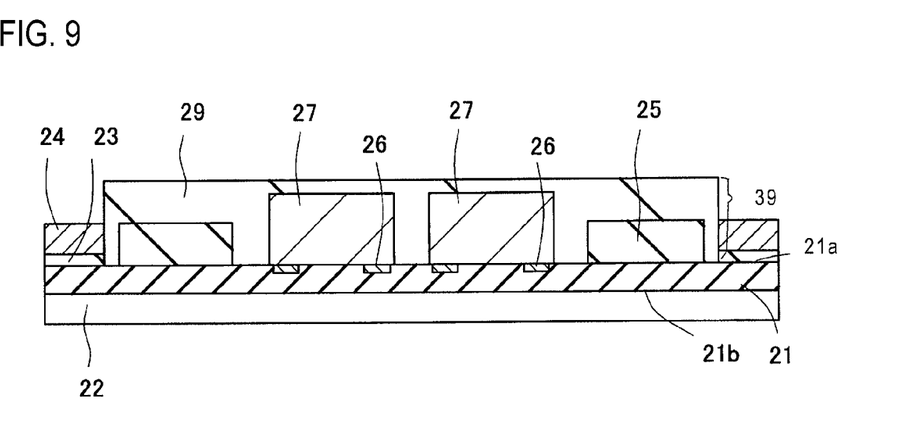

Subsequently, as shown in FIG. 9, the chip 27 on the front face 21a of the photosensitive insulating material 21 is encapsulated with a resin in such a manner that a back face of the chip 27 is covered together with the reinforcing material 25. Consequently, the chip 27 is covered with a mold resin 29 such as epoxy and is thus protected. More specifically, the front face 21a of the photosensitive insulating material 21 and the chip 27 are encapsulated with the mold resin 29 together with the reinforcing material 25 to form a resin encapsulated portion 39. The resin encapsulated portion 39 is a base substrate for the semiconductor package, and a wiring layer and an insulating layer are stacked on the resin encapsulated portion 39 as described later. At this step, the chip 27 is encapsulated with the resin at a temperature lower (for example, approximately 150° C. to 170° C.) than the curing temperature of the photosensitive insulating material 21 (for example, approximately 200° C.). The thickness of the mold resin 29 (the resin encapsulated portion 39) is approximately 150 μm to 800 μm.

It is also supposed that development cannot be carried out well in the exposed portion of the photosensitive insulating material 21 (the portion in which the via hole is formed) at a developing step to be executed in a subsequent process when a temperature which is equal to or higher than the curing temperature is applied to the photosensitive insulating material 21, for example. Therefore, in the embodiment, the temperature which is equal to or higher than the curing temperature is not applied to the photosensitive insulating material 21 until the via hole is formed in the manufacturing process.

Moreover, in the embodiment, the photosensitive insulating material 21 and the chip 27 are fixed to each other. Therefore, in the resin encapsulation, it is possible to suppress an occurrence of resin leakage causing a connecting failure or a step shown in FIG. 4. Accordingly, it is possible to suppress the reduction in the manufacturing yield of the semiconductor package.

Subsequently, the tape 22 is separated from the photosensitive insulating material 21 before the development of the photosensitive insulating material 21 in which the position of the via hole is sensitized. The photosensitive insulating material 21 and the tape 22 are bonded to each other with a silicone based adhesive material. In the embodiment, the tape 22 is used for a base material in place of a plate. Therefore, it is possible to easily peel the tape 22 from the photosensitive insulating material 21 by means of a peeling roller, for example.

Figure 10:
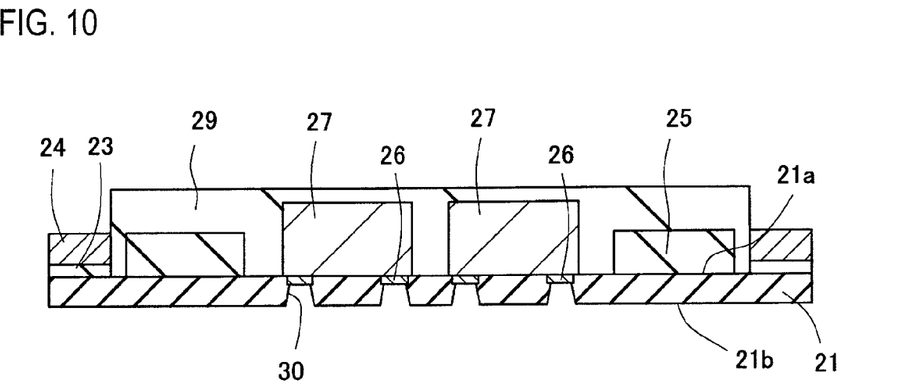

Subsequently, as shown in FIG. 10, a via hole 30 (a through hole) communicating with the connecting terminal 26 is formed on the photosensitive insulating material 21 through the development of the photosensitive insulating material 21 which is sensitized. Although the photolithographic technique is thus used for forming the via hole 30, it is also possible to propose use of a laser via technique for forming the via hole 30. However, a processing dimension can be reduced more greatly in the photolithographic technique than the laser via technique. Therefore, in the embodiment the via hole 30 is formed by using the photolithographic technique in order to form a semiconductor package which can cope with an enhancement in a fineness and a density.

Although the photosensitive insulating material 21 is exposed and the chip 27 is then encapsulated with the resin, and the photosensitive insulating material 21 is thereafter developed in the embodiment, it is also possible to develop the photosensitive insulating material 21 and to then encapsulate the chip 27 with the resin after exposing the photosensitive insulating material 21. The reason is that the via hole 30 communicating with the connecting terminal 26 is already formed when the mold resin 29 contracts during the resin encapsulation step.

Figure 11:
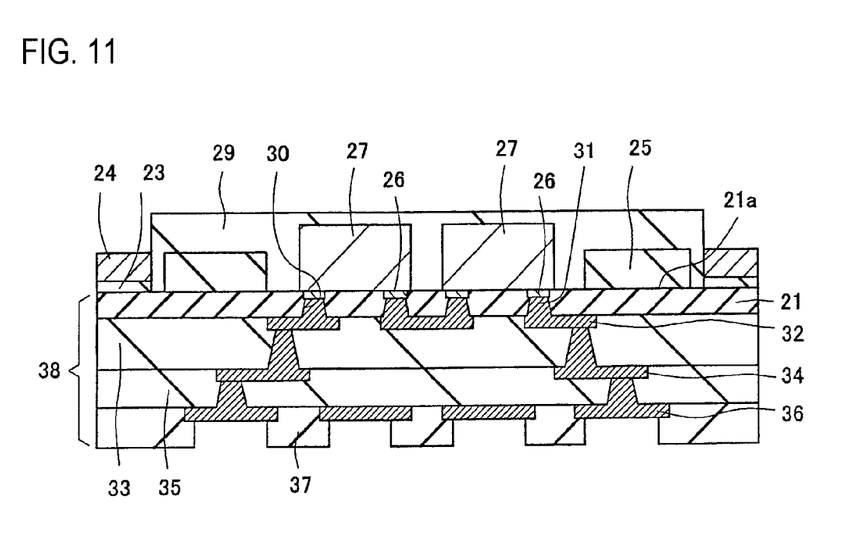

Subsequently, as shown in FIG. 11, a buildup layer is formed by the semi-additive process, for example. In other words, in the embodiment, a wiring layer and an insulating layer are formed on the resin encapsulated portion 39 including the chip 27 and the mold resin 29. In the following description, the wiring layer and the insulating layer are stacked on the resin encapsulated portion 39 by the buildup process. However, actual wiring and insulating layers are considerably thinner than the chip, and in the embodiment, the wiring layer and the insulating layer are stacked on the resin encapsulated portion 39, which is used as base substrate.

First of all, a conductive material to be electrically connected to the connecting terminal 26 is buried in the via hole 30 to form a via 31, and furthermore, to form a wiring layer 32 to be electrically connected to the via 31 on the photosensitive insulating material 21. More specifically, a seed layer (not shown) is formed in the via hole 30 and on the photosensitive insulating material 21 by nonelectrolytic plating using copper and a resist layer (not shown) provided with an opening portion is then formed in regions in which the via 31 and the wiring layer 32 are formed. For example, a copper plated film is thereafter formed in the opening portion of the resist layer by an electrolytic plating process using the seed layer for a plating conducting portion. Subsequently, after the resist layer is peeled, the seed layer is subjected to etching by using the copper plated film as a mask. Consequently, the via 31 formed in the via hole 30 and the wiring layer 32 formed on the photosensitive insulating material 21 are provided integrally.

An insulating layer 33 formed by an insulating resin such as epoxy or polyimide and having a thickness of approximately 10 μm to 15 μm is then provided to cover the wiring layer 32 disposed on the photosensitive insulating material 21, and a via hole reaching the wiring layer 32 is thereafter formed and a wiring layer 34 to be electrically connected to the wiring layer 32 through the via hole is formed. The wiring layer 34 is formed in the same manner as the wiring layer 32 and is constituted by a copper plated film, for example. Subsequently, there are provided an insulating layer 35 formed by stacking a resin film and having a thickness of approximately 20 μm to 25 μm, for example, and a wiring layer 36, which is electrically connected to the wiring layer 34. The resin film is formed by epoxy or polyimide.

Then, a solder resist layer 37 is formed on the insulating layer 35. The solder resist layer 37 has an opening portion for exposing a surface of the wiring layer 36. The solder resist layer 37 is formed by providing a film-shaped resist on the insulating layer 35 and then carrying out exposure and development over the resist, for example. The wiring layer 36 in an exposed portion from the solder resist layer 37 is used as an electrode pad. A nickel or gold plated layer may be provided on a surface of the electrode pad. Moreover, it is possible to prevent a short circuit in a connection to an external connecting terminal and to carry out a protection by the solder resist layer 37. The solder resist layer 37 has a thickness of approximately 20 μm to 25 μm. Thus, in the embodiment, the resin encapsulated portion 39 is used as the base substrate and the photosensitive insulating material 21, the wiring layers 32, 34 and 36, the insulating layers 33 and 35, and the solder resist layer 37 are stacked thereon so that a multilayer wiring structure portion 38 is obtained. The thickness of the wiring structure portion 38 (total thickness of the photosensitive insulating material 21, the wiring layers 32, 34 and 36, the insulating layers 33 and 35, and the solder resist layer 37) is approximately 56 μm to 75 μm. Since the thickness of the resin encapsulated portion 39 is larger than the thickness of the wiring structure portion 38, the semiconductor package can be formed by staking the insulating layers and wiring layers on the resin encapsulated portion 39 while the resin encapsulated portion 39 is used as the base substrate.

Figure 12:
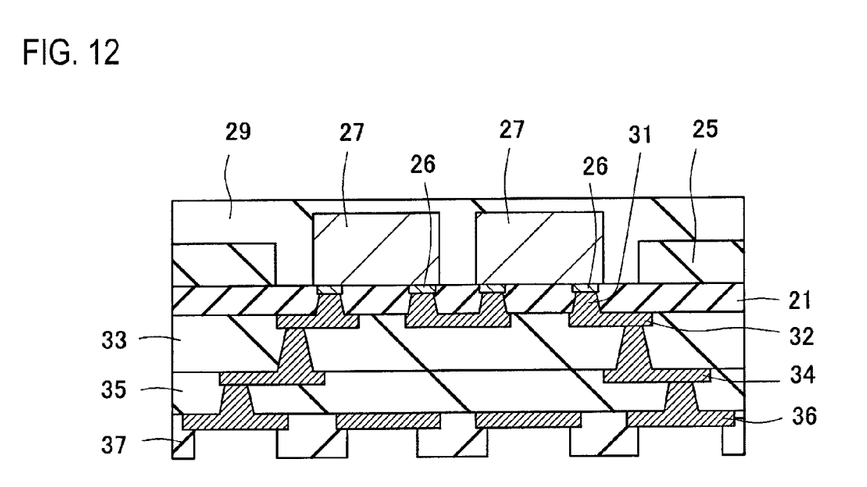

Subsequently, the mold resin 29, the reinforcing material 25 and the wiring structure portion 38 which are provided around the chip 27 between the adjacent opening portions 25a are cut to include at least one opening portion 25a in a state in which the jig 24 is bonded to the photosensitive insulating material 21. Alternatively, the mold resin 29, the reinforcing material 25 and the wiring structure portion 38 which are provided around the chip 27 between the adjacent opening portions 25a are cut to include at least one opening portion 25a after the jig 24 is separated from the photosensitive insulating material 21. Consequently, an individual piece having the chip 27 is formed so that a semiconductor package (a semiconductor device) shown in FIG. 12 is finished. Although there is described the state in which the back face of the chip 27 is covered with the mold resin 29 in the embodiment, it is also possible to polish the mold resin 29, thereby exposing the back face of the chip 27 before cutting into the individual piece. Moreover, it is also possible to obtain the semiconductor package by bonding an external connecting terminal such as a solder ball to the wiring layer 36 (the electrode pad) and then cutting them.

Thus, in the embodiment, the exposure for forming the via hole is carried out and the chip 27 is then encapsulated with the resin. Therefore, the photosensitive insulating material 21 is developed without an influence of the chip misalignment due to the expansion or contraction of the mold resin 29 in the heat treatment. Finally, it is possible to electrically connect the connecting terminal 26 and the via 31 well. Accordingly, the connecting failure is reduced. Consequently, it is possible to enhance the manufacturing yield of the semiconductor package.

What is claimed is:
1. A method of manufacturing a semiconductor package comprising:
   (a) preparing a photosensitive insulating material having a first surface and a second surface opposite to the first surface;
   (b) bonding a semiconductor chip to the first surface of the photosensitive insulating material with a connecting terminal of the semiconductor chip facing the first surface of the photosensitive insulating material;
   (c) exposing the second surface of the photosensitive insulating material after the bonding the semiconductor chip to the first surface of the photosensitive insulating material in (b);
   (d) encapsulating the first surface of the photosensitive insulating material, and the semiconductor chip bonded to the first surface, with a resin to form a resin encapsulated portion after exposing the second surface of the photosensitive insulating material in (c); and
   (e) developing the photosensitive insulating material, thereby forming a through-hole communicating with the connecting terminal of the semiconductor chip in the photosensitive insulating material after the exposing the second surface of the photosensitive insulating material in (c).

2. The method according to claim 1, wherein the developing of the photosensitive insulating material in (e) is executed after the encapsulating of the first surface of the photosensitive insulating material and the semiconductor chip with resin in (d).

3. The method according to claim 2, further comprising:
   (f) forming, a conductive material in the through-hole to electrically connect to the connecting terminal of the semiconductor chip after the developing the photosensitive insulating material in (e); and
   (g) forming a wiring layer on the second surface of the photosensitive insulating material, wherein the wiring layer is electrically connected to the conductive material.

4. The method according to claim 1,
   wherein a base material which transmits an exposing light to be used in the exposing the second surface of the photosensitive insulating material in (c) is bonded to the second surface of the photosensitive insulating material during the preparing a photosensitive insulating material in (a),
   wherein the photosensitive insulating material is exposed through the base material during the exposing the second surface of the photosensitive insulating material in (c), and
   wherein the base material is separated from the photosensitive insulating material before the developing the photosensitive insulating material in (e).

5. The method according to claim 3, wherein an annular jig is bonded to the first surface of the photosensitive insulating material and the semiconductor chip is then bonded to the first surface of the photosensitive insulating material at an inside of the jig during the bonding a semiconductor chip to the first surface of the photosensitive insulating material in (b).

6. The method according to claim 3,
   wherein a reinforcing material, which has an opening portion, is bonded to the first surface of the photosensitive insulating material and the semiconductor chip is then bonded to the first surface of the photosensitive insulating material at an inside of the opening portion during the bonding the semiconductor chip to the first surface of the photosensitive insulating material in (b), and
   wherein the reinforcing material is encapsulated with the resin together with the semiconductor chip during the encapsulating the first surface of the photosensitive insulating material in (d).

7. The method according to claim 3, wherein a periphery of the semiconductor chip is cut after the forming the wiring layer on the second surface of the photosensitive insulating material in (g) so that an individual piece having the semiconductor chip is formed.

8. The method according to claim 1, wherein the semiconductor chip is bonded to the first surface of the photosensitive insulating material while the semiconductor chip is heated at a temperature lower than a curing temperature of the photosensitive insulating material during the bonding the semiconductor chip to the first surface of the photosensitive insulating material in (b).

9. The method according to claim 1, wherein the connecting terminal protrudes from a surface of the semiconductor chip, and the connecting terminal is sunk into the photosensitive insulating material during the bonding the semiconductor chip to the first surface of the photosensitive insulating material in (b).

10. The method according to claim 1, wherein the semiconductor chip is encapsulated with the resin at a temperature lower than the curing temperature of the photosensitive insulating material during the encapsulating the first surface of the photosensitive insulating material in (d).

11. The method according to claim 1, further comprising:
(h) forming a wiring structure portion on the second surface of the photosensitive insulating material by stacking a wiring layer and an insulating layer on the second surface of the photosensitive insulating material using the resin encapsulated portion as base substrate after the encapsulating the first surface of the photosensitive insulating material and the semiconductor chip in (d).

* * * * *